(12) United States Patent
Xu

(10) Patent No.: US 12,322,459 B2
(45) Date of Patent: Jun. 3, 2025

(54) SIMULATION TEST MODEL FOR ANTI-FUSE CIRCUIT AND CIRCUIT TESTING METHOD

(71) Applicant: CHANGXIN MEMORY TECHNOLOGIES, INC., Hefei (CN)

(72) Inventor: Qian Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 218 days.

(21) Appl. No.: 17/936,381

(22) Filed: Sep. 28, 2022

(65) Prior Publication Data

US 2023/0016004 A1    Jan. 19, 2023

Related U.S. Application Data

(63) Continuation of application No. PCT/CN2022/106219, filed on Jul. 18, 2022.

(30) Foreign Application Priority Data

Jul. 4, 2022 (CN) .......................... 202210786596.7

(51) Int. Cl.
*G11C 17/16* (2006.01)
*H10B 20/25* (2023.01)

(52) U.S. Cl.
CPC ............. *G11C 17/16* (2013.01); *H10B 20/25* (2023.02)

(58) Field of Classification Search
None
See application file for complete search history.

(56) References Cited

U.S. PATENT DOCUMENTS

| 6,410,398 B1 * | 6/2002 | Forel | H01L 29/66166 438/383 |
| 8,554,531 B2 * | 10/2013 | Nicollian | G06F 30/367 327/581 |
| 11,303,118 B2 * | 4/2022 | Tailliet | H02H 9/046 |
| 2009/0164196 A1 * | 6/2009 | Saitou | G06F 30/367 703/14 |
| 2019/0341393 A1 * | 11/2019 | Peng | H10B 20/25 |
| 2021/0125999 A1 * | 4/2021 | Ju | H10D 64/512 |

FOREIGN PATENT DOCUMENTS

CN        103838927 B    2/2018

OTHER PUBLICATIONS

Amerasekera et al. "Modeling MOS Snapback and Parasitic Bipolar Action for Circuit-Level ESD and High Current Simulations" Proceedings of International Reliability Physics Symposium 1996, pp. 318-326. (Year: 1996).*

Mergens et al. "Modular approach of a high current MOS compact model for circuit-level ESD simulation including transient gate-coupling behaviour" Microelectronics Reliability 40 (2000) pp. 99-115. (Year: 2000).*

(Continued)

*Primary Examiner* — J. H. Hur
(74) *Attorney, Agent, or Firm* — Syncoda LLC; Feng Ma

(57) ABSTRACT

An anti-fuse circuit includes the following: a first transistor, and at least one parasitic transistor and at least one parasitic triode that are connected to the first transistor. The at least one parasitic transistor and the at least one parasitic triode are connected to a first node.

18 Claims, 12 Drawing Sheets

(56) References Cited

OTHER PUBLICATIONS

Vassilev et al. "MOSFET ESD Breakdown Modeling and Parameter Extraction in Advanced CMOS Technologies" IEEE Transactions on Electron Devices, vol. 53, No. 9, Sep. 2006, pp. 2108-2117. (Year: 2006).*

Rodríguez et al. "A Model for Gate-Oxide Breakdown in CMOS Inverters" IEEE Electron Device Letters, vol. 24, No. 2, Feb. 2003, pp. 114-116. (Year: 2003).*

* cited by examiner

SIMULATION TEST MODEL FOR ANTI-FUSE CIRCUIT AND CIRCUIT TESTING METHOD

CROSS-REFERENCE TO RELATED APPLICATIONS

This is a continuation of International Patent Application No. PCT/CN2022/106219 filed on Jul. 18, 2022, which claims priority to Chinese Patent Application No. 202210786596.7 filed on Jul. 4, 2022. The disclosures of the above-referenced applications are hereby incorporated by reference in their entirety.

BACKGROUND

A test model for a device is a communication bridge between an integrated circuit designer (IC designer) and a wafer fabrication (Fab). An accurate test model is very important for circuit design. SPICE (Simulation program with integrated circuit emphasis) is the most common and commonly used circuit-level simulation program. Starting from basic components (such as transistors, resistors and capacitors) of a circuit, a SPICE model performs modeling based on working principles of the components and model parameters and mode equations of the components, to mathematically predict electrical behaviors of the components under different conditions. When an existing SPICE model is used for performing a simulation test on an anti-fuse device, the electrical behaviors of the device are often not accurately described, so the existing SPICE model used is not accurate enough. How to establish an accurate test model for the anti-fuse device has become an urgent problem to be solved.

SUMMARY

The present disclosure relates to the field of semiconductor technologies, and provides an anti-fuse circuit and a circuit testing method.

In a first aspect, an embodiment of the present disclosure provides an anti-fuse circuit.

The anti-fuse circuit includes a first transistor, and at least one parasitic transistor and at least one parasitic triode that are connected to the first transistor.

The at least one parasitic transistor and the at least one parasitic triode are connected to a first node.

In a second aspect, an embodiment of the present disclosure further provides a circuit testing method. The circuit testing method includes the following operations.

An anti-fuse circuit is established based on an anti-fuse transistor in a breakdown state. The anti-fuse circuit includes: a first transistor, at least one parasitic transistor and at least one parasitic triode.

Testing is performed on the anti-fuse transistor in the breakdown state based on the anti-fuse circuit.

DETAILED DESCRIPTION

In order to facilitate understanding of the present disclosure, the present disclosure will be described more fully below with reference to the related drawings. Preferred embodiments of the present disclosure are illustrated in the accompanying drawings. However, the present disclosure can be embodied in many different forms and is not limited to the embodiments described herein. Rather, these embodiments are provided to make the present disclosure more thorough and complete.

Unless otherwise defined, all technical and scientific terms used herein have the same meaning as commonly understood by one of ordinary skill in the art to which this disclosure belongs. The terms used in the specification of the present disclosure are for the purpose of describing particular embodiments only, and are not intended to limit the present disclosure. As used herein, the term "and/or" includes any and all combinations of one or more of the associated and listed items.

An anti-fuse transistor is a one-time programmable (OTP) device and is widely used in dynamic random access memories (DRAM) and other memories. An anti-fuse circuit device includes a control terminal of the anti-fuse transistor, the control terminal is configured to control the anti-fuse transistor to be turned on through programming, and the anti-fuse transistor includes a gate, a doped substrate and a gate dielectric layer between the gate and the doped substrate. In a case that the anti-fuse transistor is not programmed, two conductive layers are separated by the gate dielectric layer, and thus two terminals of the anti-fuse transistor are open-circuited. In a case that the anti-fuse transistor is programmed (i.e., programming the anti-fuse transistor by applying a high voltage to the gate and connecting the doped substrate to a low voltage), the gate dielectric layer is broken down by the high voltage, the two conductive layers are electrically connected, and the anti-fuse transistor is short-circuited. In such a case, the anti-fuse transistor converts from a non-breakdown state to a breakdown state, and a voltage transmission can be performed between the gate and the doped substrate. In the one-time programmable memory, memory cells of the anti-fuse transistor can be programmed so that different memory cells in the memory are in a breakdown state or a non-breakdown state, respectively, thereby realizing the function of storing data.

Figure 1:
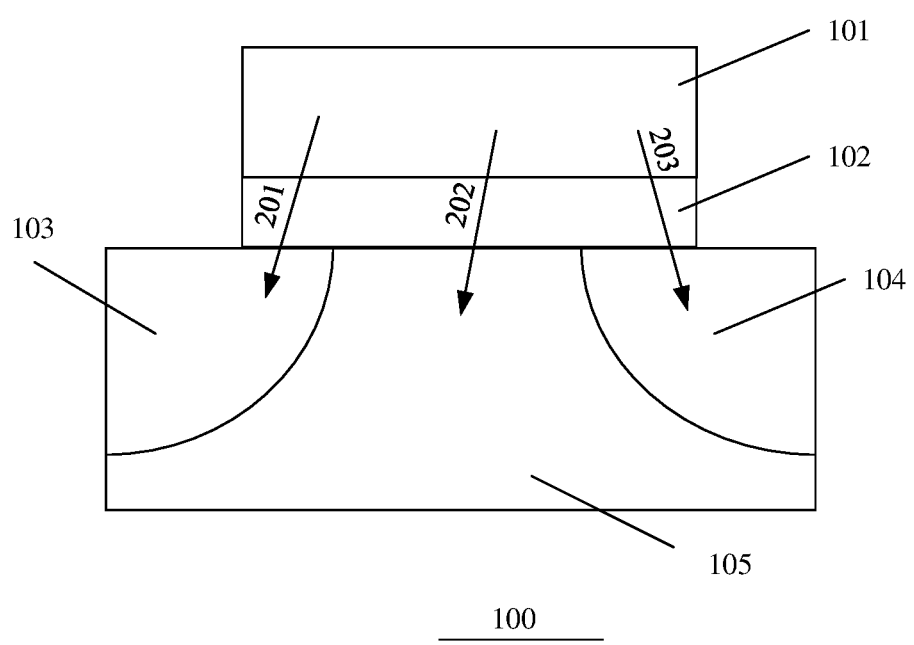
FIG. 1 is a schematic diagram of an anti-fuse transistor provided by an embodiment of the present disclosure.

FIG. 1 is a structural diagram of an anti-fuse transistor 100. The anti-fuse transistor 100 may include a source 103 and a drain 104 located in a semiconductor substrate 105, a gate 101 located on a substrate, and a gate dielectric layer 102 located between the substrate 105 and the gate 101.

The semiconductor substrate 105 may include: a P-type semiconductor material substrate, such as a silicon (Si) substrate or a germanium (Ge) substrate; an N-type semiconductor substrate, such as an indium phosphide (InP) substrate; a compound semiconductor material substrate, such as a silicon germanium (SiGe) substrate; a silicon-on-insulator (SOI) substrate and a germanium-on-insulator (GeOI) substrate, and/or the like.

In some embodiments, the semiconductor substrate 105 can be a P-type substrate or a P-type well region, and each of the source 103 and the drain 104 can be an N-type doped region. In some embodiments, the semiconductor substrate 105 can be an N-type substrate or an N-type well region, and each of the source 103 and the drain 104 can be a P-type doped region.

A breakdown state and a non-breakdown state of the anti-fuse transistor 100 can be represented by logic values "0" and "1", respectively. In some embodiments, the logic value of "0" represents the breakdown state of the anti-fuse transistor, and the logic value of "1" represents the non-breakdown state of the anti-fuse transistor. In some embodiments, the logic value of "1" represents the breakdown state of the anti-fuse transistor, and the logic value of "0" represents the non-breakdown state of the anti-fuse transistor.

The anti-fuse transistor 100 changing from the non-breakdown state to the breakdown state means programming the anti-fuse transistor 100. Programming the anti-fuse transistor 100 includes applying a high voltage $V_G$ to the gate 101 and applying a low voltage Vs to the source 103 to form a conductive path between the gate 101 and the source 103 or form a conductive path between the gate 101 and the drain 104. There can be multiple conductive paths, such as a conductive path 201, a conductive path 202 and a conductive path 203 as illustrated in FIG. 1. The conductive path 201 is a conductive path formed between the gate 101 and the source 103, the conductive path 202 is a conductive path formed between the gate 101 and the semiconductor substrate 105, and the conductive path 203 is a conductive path formed between the gate 101 and the drain 104.

Figure 2:
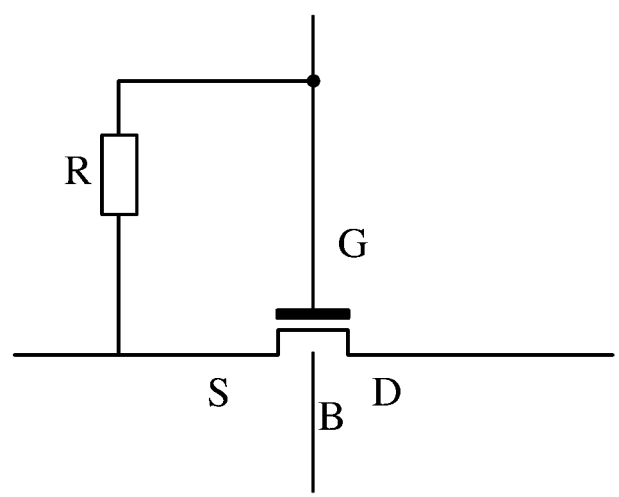
FIG. 2 is a first schematic diagram of an anti-fuse circuit provided by an embodiment of the present disclosure.

In some embodiments, after the hard breakdown occurs in the anti-fuse transistor, i.e., the anti-fuse transistor is programmed, an anti-fuse circuit 1000 illustrated in FIG. 2 can be used to simulate the anti-fuse transistor. By default, the anti-fuse circuit 1000 can form, after the hard breakdown occurs in the anti-fuse transistor, the conductive path 201 between the gate and source or form the conductive path 203 between the gate and the drain. Considering that a parasitic resistor R between the gate (G) and the source (S) or between the gate and the drain (D) has a certain voltage drop, when a circuit simulation test is performed on the anti-fuse transistor over which the hard breakdown occurs, the anti-fuse circuit 1000 with the parasitic resistor R between the gate and source or between the gate and the drain can be brought into the relevant circuit test environment for performing the simulation test. However, when the anti-fuse circuit 1000 is used for performing the simulation test, a voltage-current curve obtained through the test may not in line with a test voltage-current curve of the actual anti-fuse transistor. In such a case, it is considered that accuracy of the anti-fuse circuit 1000 for performing simulation is limited.

An embodiment of the present disclosure provides an anti-fuse circuit. In particular, the anti-fuse circuit is an equivalent circuit of an anti-fuse device in a breakdown state. The anti-fuse device includes at least one anti-fuse transistor over which the hard breakdown occurs in a region between the gate and the source-drain (i.e., the conductive path 202 is formed).

Figure 3:
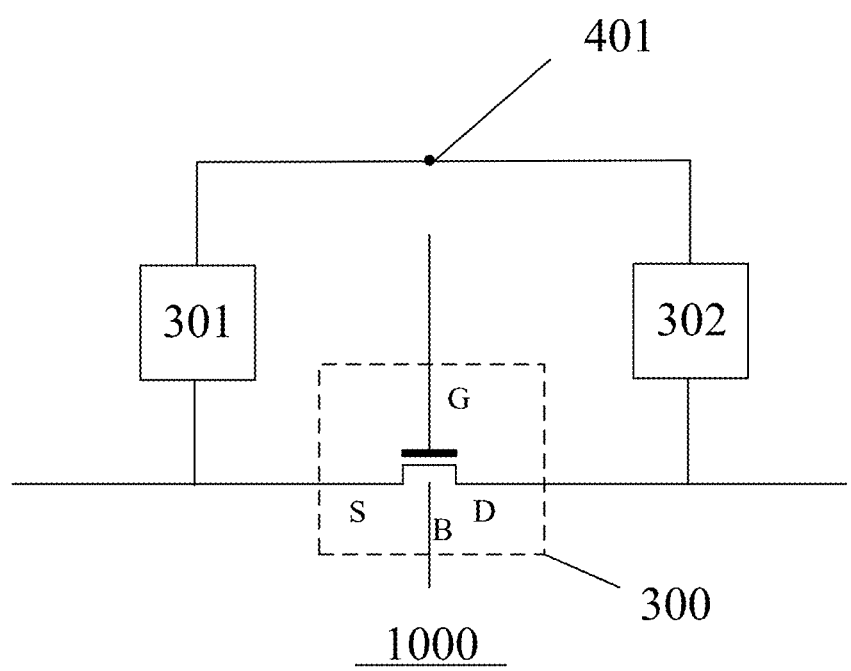
FIG. 3 is a second schematic diagram of an anti-fuse circuit provided by an embodiment of the present disclosure.

An embodiment of the present disclosure provides an anti-fuse circuit. As illustrated in FIG. 3, the anti-fuse circuit 1000 can be used to simulate and test an anti-fuse transistor in a breakdown state.

The anti-fuse circuit 1000 includes a first transistor 300, and at least one parasitic transistor 301 and at least one parasitic triode 302 that are connected to the first transistor 300.

The at least one parasitic transistor 301 and the at least one parasitic triode 302 are connected to a first node 401. The anti-fuse circuit is an equivalent circuit of the anti-fuse transistor in the breakdown state, and the first node 401 is used to represent a breakdown point of the anti-fuse transistor in the breakdown state.

The anti-fuse transistor can be an NMOS transistor, a PMOS transistor, or the like. The anti-fuse transistor may be in the breakdown state and a non-breakdown state. Characteristics of the anti-fuse transistor in the non-breakdown state are the same as characteristics of a normal MOS transistor. The anti-fuse circuit 1000 provided by the embodiment of the present disclosure can be used to simulate and test the anti-fuse transistor in the breakdown state.

The anti-fuse circuit 1000 provided by the embodiment of the present disclosure includes a first transistor 300, and the first transistor 300 can be used to simulate a basic structure and characteristics of the anti-fuse transistor in the non-breakdown state. That is to say, the first transistor 300 has the same electrical parameters as the anti-fuse transistor in the non-breakdown state.

When the anti-fuse transistor is broken down, the breakdown point is formed at a junction of a gate dielectric layer and a substrate (including a source and a drain, because the source and drain are also formed in the substrate by doping) of the anti-fuse transistor. In an embodiment of the present disclosure, the first node 401 in the anti-fuse circuit 1000 can be used to simulate the breakdown point of the anti-fuse transistor.

When the anti-fuse transistor is broken down, the anti-fuse transistor generates a parasitic effect near the breakdown point, so that electrical characteristics of the anti-fuse transistor after being broken down are different from electrical characteristics of the anti-fuse transistor before being broken down. Therefore, the at least one parasitic transistor 301 and the at least one parasitic triode 302 that are connected to the first node 401 in the anti-fuse circuit are used to reflect electrical characteristics of the anti-fuse transistor after being broken down and resulting in the parasitic effect. The parasitic transistor 301 can be a field effect transistor which includes an NMOS or a PMOS. The parasitic triode 302 can include an NPN type triode or a PNP type triode. Through a connection of the at least one parasitic transistor 301 and the at least one parasitic triode 302, actual electrical characteristics of the anti-fuse transistor after being broken down can be effectively reflected. In addition, different types and different numbers of parasitic transistors and parasitic triodes can be used for performing the simulation test on different anti-fuse transistors, so as to accurately test characteristics of various anti-fuse transistors.

The anti-fuse circuit provided by the embodiment of the present disclosure can be used to simulate and test an anti-fuse device. In the present disclosure, electrical characteristics of the anti-fuse transistor in the breakdown state are simulated by the first transistor 300 and the at least one parasitic transistor 301 and the at least one parasitic triode 302 that are connected to the first transistor. Compared with a method of simply simulating the anti-fuse transistor in the breakdown state by only setting a certain resistance value between the gate and the source or between the gate and the drain, the anti-fuse circuit according to the present disclosure can realize a more accurate description of electrical characteristics of the anti-fuse transistor in the breakdown state. Application of the anti-fuse circuit in a circuit simulation test can achieve a more accurate test effect and facilitate experiments and researches on a memory and a circuit including the anti-fuse transistor.

Figure 4:
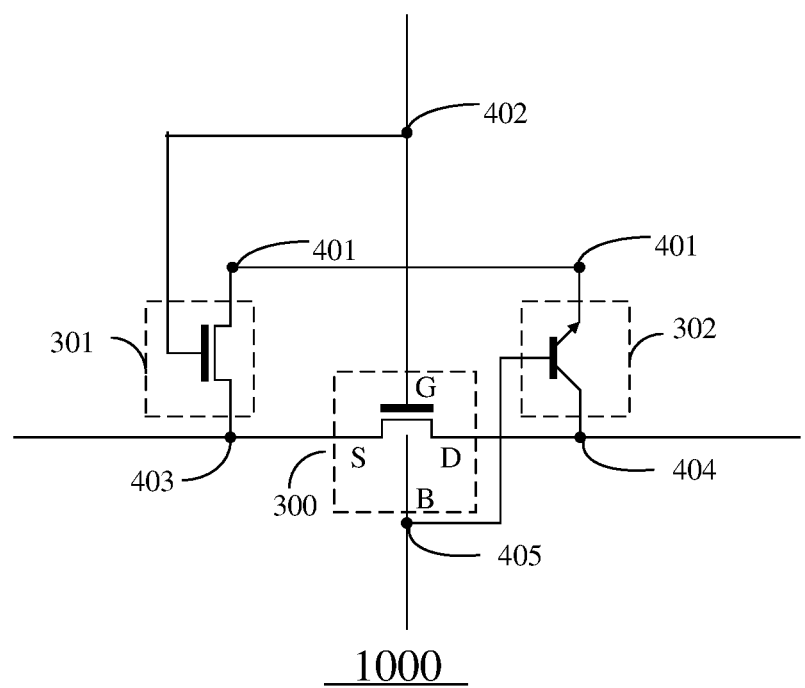
FIG. 4 is a schematic diagram of another anti-fuse circuit provided by an embodiment of the present disclosure.

In some embodiments, as illustrated in FIG. 4, a gate G of the first transistor 300 is a second node 402, a first electrode S of the first transistor 300 is a third node 403, and a second electrode D of the first transistor is a fourth node 404, and a substrate B of the first transistor 300 is a fifth node 405.

A source of the parasitic transistor 301 is connected to the third node 403 or the fourth node 404.

A gate of the parasitic transistor 301 is connected to the second node 402.

A drain of the parasitic transistor 301 is connected to the first node 401.

A collector of the parasitic triode 302 is connected to the third node 403 or the fourth node 404.

An emitter of the parasitic triode 302 is connected to the first node 401.

A base of the parasitic triode 302 is connected to the fifth node 405.

The first electrode of the first transistor 300 can be the source S or the drain D of the first transistor. For the convenience of description, the first electrode of the first transistor 300 is set to be the source S, and the second electrode of the transistor 300 is set to be the drain D.

In the embodiment of the present disclosure, the parasitic transistor 301 and the parasitic triode 302 are used to describe the parasitic effect near the breakdown point of the anti-fuse transistor in the breakdown state. Therefore, the parasitic transistor 301 and the parasitic triode 302 can be connected between the first node 401 and the first transistor 300 in the anti-fuse circuit. Specifically, the source of the parasitic transistor 301 can be connected to the source S or the drain D of the first transistor 300. That is to say, the source of the parasitic transistor 301 can be connected to the third node 403 or the fourth node 404. The drain of the parasitic transistor 301 can be connected to the first node 401, and the gate of the parasitic transistor 301 can be connected to the gate G of the first transistor 300. Similarly, the emitter of the parasitic triode 302 can be connected to the first node 401, and the collector of the parasitic triode 302 is connected to the source S or the drain D of the first transistor 300. That is to say, the collector of the parasitic triode 302 is connected to the third node or the fourth node. The base of the parasitic triode 302 can be connected to the substrate B of the first transistor 300. In this way, a complete circuit connection relationship is realized.

Figure 5:
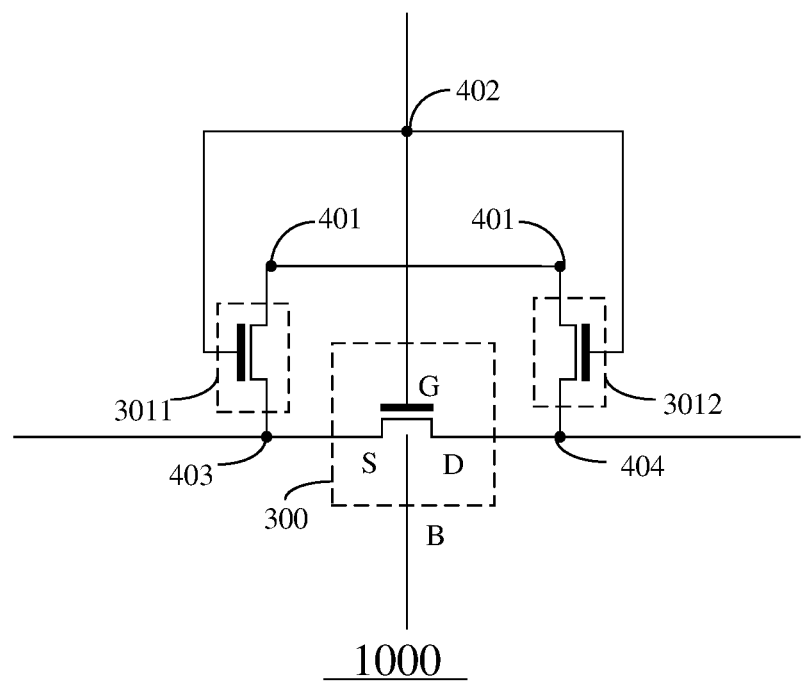
FIG. 5 is a schematic diagram of yet another anti-fuse circuit provided by an embodiment of the present disclosure.

In some embodiments, as illustrated in FIG. 5, the at least one parasitic transistor includes a first parasitic field effect transistor 3011 and a second parasitic field effect transistor 3012.

A gate of the first parasitic field effect transistor 3011 is connected to the second node 402.

A source of the first parasitic field effect transistor 3011 is connected to the third node 403.

A drain of the first parasitic field effect transistor 3011 is connected to the first node 401.

A gate of the second parasitic field effect transistor 3012 is connected to the second node 402.

A source of the second parasitic field effect transistor 3012 is connected to the fourth node 404.

A drain of the second parasitic field effect transistor 3012 is connected to the first node 401.

The at least one parasitic transistor in the implementation of the present disclosure can be one parasitic transistor or two parasitic transistors, or can be more than two parasitic transistors. In the present disclosure, the at least one parasitic transistor being two parasitic transistors is taken as an example. That is to say, the at least one parasitic transistor includes the first parasitic field effect transistor 3011 and the second parasitic field effect transistor 3012.

The source of the first parasitic field effect transistor 3011 is connected to the source S of the first transistor 300. That is to say, the source of the first parasitic field effect transistor 3011 is connected to the third node. The drain of the first parasitic field effect transistor 3011 is connected to the first node 401, and the gate of the first parasitic field effect transistor 3011 is connected to the gate G of the first transistor 300.

The source of the second parasitic field effect transistor 3012 is connected to the drain D of the first transistor 300. That is to say, the source of the second parasitic field effect transistor 3012 is connected to the fourth node. The drain of the second parasitic field effect transistor 3012 is connected to the first node 401, and the gate of the second parasitic field effect transistor 3012 is connected to the gate G of the first transistor 300.

In this way, the breakdown effect of the anti-fuse transistor can be represented by two parasitic field effect transistors positioned on both sides of the first transistor, and the two parasitic field effect transistors can be the same or different. For anti-fuse transistors with different characteristics, more accurate simulation test data can be obtained by flexibly setting parameters of the two parasitic field effect transistors. Exemplarily, the parameters of the two parasitic field effect transistors can be set based on a position of the breakdown point of the anti-fuse transistor, and the parameters include a gate length, a threshold voltage and the like of the parasitic field effect transistor.

Figure 6:
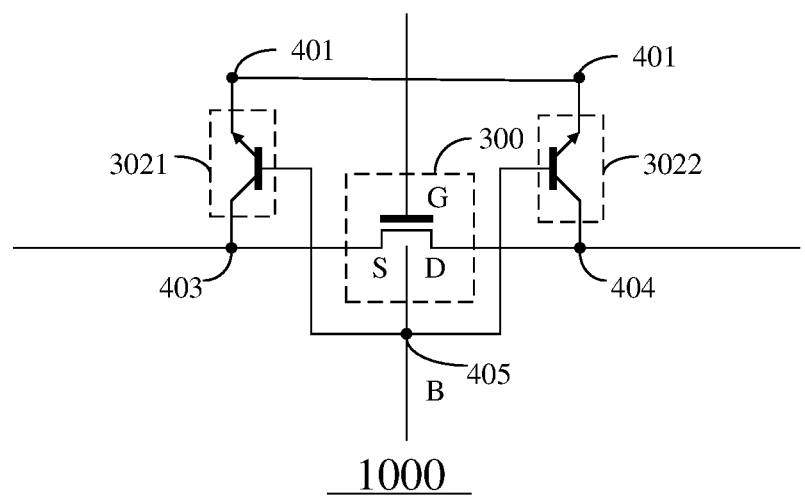
FIG. 6 is a schematic diagram of still another anti-fuse circuit provided by an embodiment of the present disclosure.

In some embodiments, as illustrated in FIG. 6, the at least one parasitic triode includes a first parasitic triode 3021 and a second parasitic triode 3022.

An emitter of the first parasitic triode 3021 is connected to the first node 401.

A collector of the first parasitic triode 3021 is connected to the third node 403.

A base of the first parasitic triode 3021 is connected to the fifth node 405.

An emitter of the second parasitic triode 3022 is connected to the first node 401.

A collector of the second parasitic triode 3022 is connected to the fourth node 404.

A base of the second parasitic triode 3022 is connected to the fifth node 405.

In the embodiment of the present disclosure, the anti-fuse circuit may include one parasitic triode, two parasitic triodes, or more than two parasitic triodes. In the present disclosure, at least one parasitic triode being two parasitic triodes is taken as an example. That is to say, the at least one parasitic triode includes the first parasitic triode 3021 and the second parasitic triode 3022.

The emitter of the first parasitic triode 3021 can be connected to the first node 401, and the collector of the first parasitic triode 3021 is connected to the source S of the first transistor 300. That is to say, the collector of the first parasitic triode 3021 is connected to the third node. In addition, the base of the first parasitic triode 3021 can be connected to the substrate B of the first transistor 300. The second parasitic triode 3022 can be connected to the first parasitic triode 3021 in a symmetrical manner relative to the first transistor 300.

In this way, two parasitic triodes are disposed on both sides of the first transistor respectively, and parameters of the two parasitic triodes can be the same or different. Similar to the parasitic field effect transistor in the above embodiment, parameters of the two parasitic triodes can also be determined based on characteristics of the anti-fuse transistor to be tested by the two parasitic triodes.

By setting the anti-fuse circuit with two parasitic field effect transistors and two parasitic triodes, parameters of the anti-fuse circuit can be flexibly configured, so that more accurate simulation tests result can be achieved for anti-fuse transistors with different breakdown points.

Figure 7:
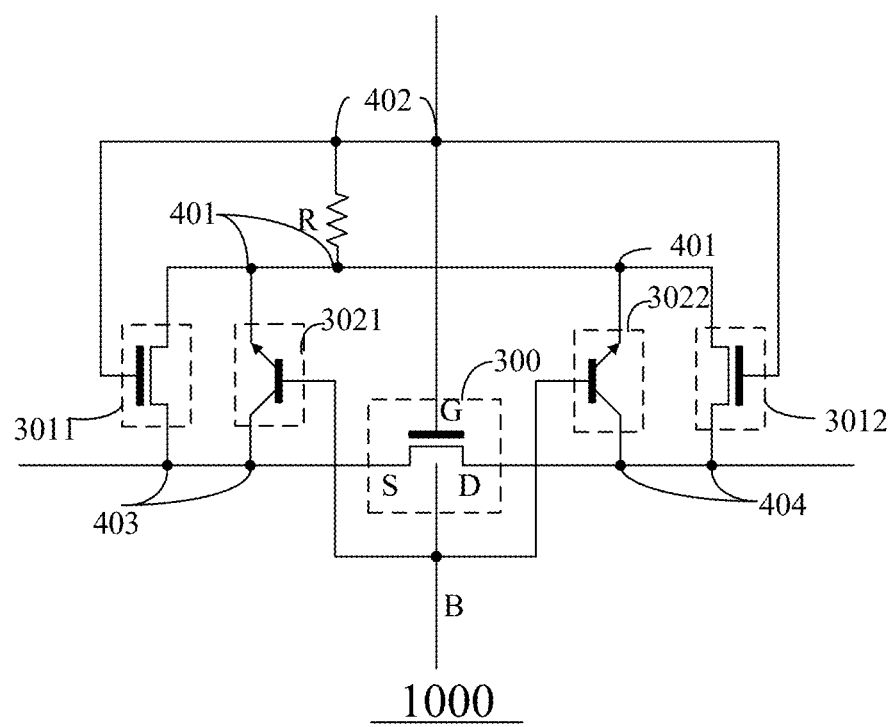
FIG. 7 is a first schematic diagram of yet still another anti-fuse circuit provided by an embodiment of the present disclosure.

In some embodiments, as illustrated in FIG. 7, the anti-fuse circuit further includes a parasitic resistor 501 connected between the first node 401 and the second node 402.

When the anti-fuse transistor is broken down, a current path is generated between the gate and the substrate of the anti-fuse transistor, but a certain resistance will still exist in the current path. Therefore, the anti-fuse circuit provided by the embodiment of the present disclosure further includes the parasitic resistor connected between the first node 401 and the second node 402, and the parasitic resistor can be used to simulate resistance characteristics of the current path generated after the anti-fuse transistor is broken down, so as to achieve a more accurate simulation test effect.

In some embodiments, a resistance of the parasitic resistor has a first corresponding relationship with a position parameter of the breakdown point.

In some embodiments, a gate length of the parasitic transistor has a second corresponding relationship with the position parameter of the breakdown point.

A base length of the parasitic triode has a third corresponding relationship with the position parameter of the breakdown point.

Simulation parameters of each simulation element/component in the anti-fuse circuit need to be determined based on characteristics of the anti-fuse transistor simulated. The simulation parameters may include the resistance of the parasitic resistor, and/or may include structural parameters and electrical parameters of the parasitic transistor, and the like. Exemplarily, the structural parameters of the parasitic transistor may include a gate length, a gate oxide thickness, a source-drain doping concentration of the parasitic field effect transistor, a base length and an emitter doping concentration of the parasitic triode, and the like. The electrical parameters of the parasitic transistor may further include a threshold voltage of the parasitic field effect transistor, and a current amplification factor, a maximum collector current, a maximum reverse voltage and a reverse current of the parasitic triode, and the like.

In the present disclosure, values of the simulation parameters in the anti-fuse circuit can be determined based on the position of the breakdown point of the anti-fuse transistor in the breakdown state. Exemplarily, the resistance R of the parasitic resistor can be determined based on the position of the breakdown point of the anti-fuse transistor. For example, if the position parameter X of the breakdown point represents the position of the breakdown point, the resistance R of the parasitic resistor can be represented as a function of the position parameter of the breakdown point, i.e., $R=f_1(X)$, which is the first corresponding relationship. Other structural parameters of the parasitic transistor, including the gate oxide thickness and the source-drain doping concentration of the parasitic field effect transistor and the like, are determined based on a gate oxide thickness and a source-drain doping concentration of the anti-fuse transistor itself.

In addition, the structural parameters of the parasitic transistor, such as the gate length $L_g$ of the parasitic field effect transistor, can be determined based on the position of the breakdown point of the anti-fuse transistor. If the position parameter X of the breakdown point represents the position of breakdown point, the gate length $L_g$ of the parasitic field effect transistor can be represented as a function of the position parameter of the breakdown point, i.e., $L_g=f_2(X)$, which is the second corresponding relationship.

Correspondingly, the structural parameters of the parasitic triode, such as the base length $L_b$ of the parasitic triode, can also be determined based on the position of the breakdown point of the anti-fuse transistor. If the position parameter X of the breakdown point represents the position of breakdown point, the base length $L_b$ of the parasitic triode can be represented as a function of the position parameter of the breakdown point, i.e., $L_b=f_3(X)$, which is the third corresponding relationship. Other structural parameters of the parasitic triode, including the emitter doping concentration of the parasitic triode, can be determined based on the source-drain doping concentration of the anti-fuse transistor itself.

In practical applications, the anti-fuse circuit corresponding to the simulation parameters of the simulation elements can be configured based on relevant parameters of the anti-fuse transistor for which the simulation test needs to be performed, and the anti-fuse circuit is used for the simulation test, so that a more realistic simulation test result can be obtained.

In some embodiments, the position parameter of the breakdown point includes at least one of: a preset first distance parameter or a preset second distance parameter. The first distance parameter is used to represent a distance from the breakdown point of the anti-fuse transistor to a first electrode of the anti-fuse transistor, and the second distance parameter is used to represent a distance from the breakdown point of the anti-fuse transistor to a second electrode of the anti-fuse transistor. Since both the first electrode and the second electrode of the anti-fuse transistor are doped regions with a certain width, the distance from the breakdown point to the first electrode of the anti-fuse transistor can be a distance from the breakdown point to a midpoint of the first electrode, and the distance from the breakdown point to the second electrode of the anti-fuse transistor can be a distance from the breakdown point to a midpoint of the second electrode. Considering ion concentration distribution of the doped region, a point with the high and uniformly distributed ion concentration in the middle of the doped region is taken as a simulated standard position at the first electrode or second electrode.

The position parameter of the breakdown point is a parameter for representing position characteristics of the breakdown point in the anti-fuse transistor.

Each of the resistance of the parasitic resistor, the gate length of the parasitic field effect transistor and the base length of the parasitic triode has a corresponding relationship with the position parameter of the breakdown point. If positions of the breakdown points in the same anti-fuse transistor are different, then the resistance of the parasitic resistor, and the structural characteristics and the electrical parameters of the parasitic field effect transistor and the parasitic triode can be changed correspondingly based on different breakdown point positions. Therefore, the simulation test for the anti-fuse transistor in different breakdown states can be realized by setting the anti-fuse circuits with different position parameters.

The breakdown point described in the embodiments of the present disclosure is located between the source and drain of the anti-fuse transistor, so the position parameter of the breakdown point can be represented based on a distance between the breakdown point of the anti-fuse transistor and at least one of the source or drain of the anti-fuse transistor. The first distance parameter is used to represent a distance $X_1$ from the breakdown point to the source of the anti-fuse transistor, and the second distance parameter is used to represent a distance $X_2$ from the breakdown point to the drain of the anti-fuse transistor. It can be understood that a sum of the first distance parameter $X_1$ and the second distance parameter $X_2$ is a distance $X_3$ between the source and the drain of the anti-fuse transistor. The distance $X_3$ between the source and the drain of the anti-fuse transistor is a structural parameter of the anti-fuse transistor. For a certain anti-fuse transistor, $X_3$ is a constant parameter. Therefore, the second distance parameter can be represented based on the first distance parameter, i.e., $X_2=X_3-X_1$. Similarly, the first distance parameter can also be represented based on the second distance parameter, i.e., $X_1=X_3-X_2$.

Therefore, in practice, when the anti-fuse circuit described in the embodiment of the present disclosure is used to test the anti-fuse device, based on the preset first distance parameter $X_1$ or the preset second distance parameter $X_2$ and based on the structural characteristics and electrical parameters of the anti-fuse transistor itself, a required anti-fuse circuit can be established for performing the simulation test.

Figure 8:
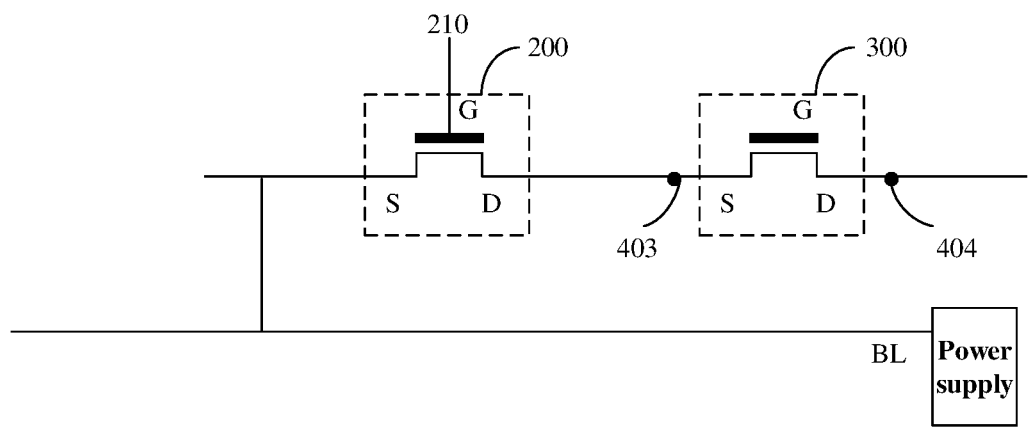
FIG. 8 is a second schematic diagram of yet still another anti-fuse circuit provided by an embodiment of the present disclosure.

In some embodiments, as illustrated in FIG. 8, the anti-fuse circuit further includes a second transistor 200 connected to the first transistor 300.

A first electrode of the second transistor 200 is connected to the third node 403 or the fourth node 404.

A second electrode of the second transistor 200 is connected to a power supply terminal.

A gate of the second transistor 200 is connected to a first control signal terminal 210. The first control signal terminal 210 is configured to provide a control signal for the second transistor 200.

The second transistor 200 is configured to perform a programming operation or a reading operation on the first transistor 300.

In some embodiments, an anti-fuse unit may be formed by a selection device and the anti-fuse transistor. The selection device includes, but is not limited to, diodes and transistors.

The second transistor 200 can be used for simulating the selection device in the anti-fuse unit. The anti-fuse circuit formed by connecting the second transistor 200 to the first transistor 300 is used for performing the simulation test on the anti-fuse unit.

When the simulation test needs to be performed on the anti-fuse unit in the non-breakdown state, the anti-fuse circuit including the second transistor 200 and the first transistor 300 in series as illustrated in FIG. 8 can be used. The first electrode of the second transistor 200 can be a source or a drain. The first electrode of the second transistor 200 can be connected to the source or drain of the first transistor 300. That is to say, the first electrode of the second transistor 200 can be connected to the third node 403 or the fourth node 404. The first electrode of the second transistor 200 can be the source or the drain, and correspondingly, the second electrode of the second transistor 200 can be the drain or the source, the gate of the first transistor 300 is connected to a programming signal terminal, and the first transistor 300 can respond to programming signals.

When the anti-fuse unit is used to form a memory array, the second electrode of the second transistor 200 can further be connected to a bit line (BL), and connected to a power supply via the bit line. The gate of the second transistor 200 is connected to the first control signal terminal 210, and the first control signal terminal 210 is configured to control the second transistor 200 to be turned on or turned off.

When the programming operation needs to be performed on the first transistor 300 in the anti-fuse unit, the second transistor 200 can be used to perform the programming operation on the first transistor 300. The programming operation includes following actions. A ground voltage (e.g., 0V) is applied to the BL and a selected voltage (Vdd) is applied to the second transistor 200 by the first control signal terminal 210, the second transistor 200 is turned on; the source of the first transistor 300 is grounded, a programming voltage (Vp) is applied to the first transistor 300 by the programming signal terminal, the programming voltage being greater than the selected voltage, when the programming voltage exceeds a withstand voltage of the first transistor 300, the first transistor 300 is turned on.

Figure 9:
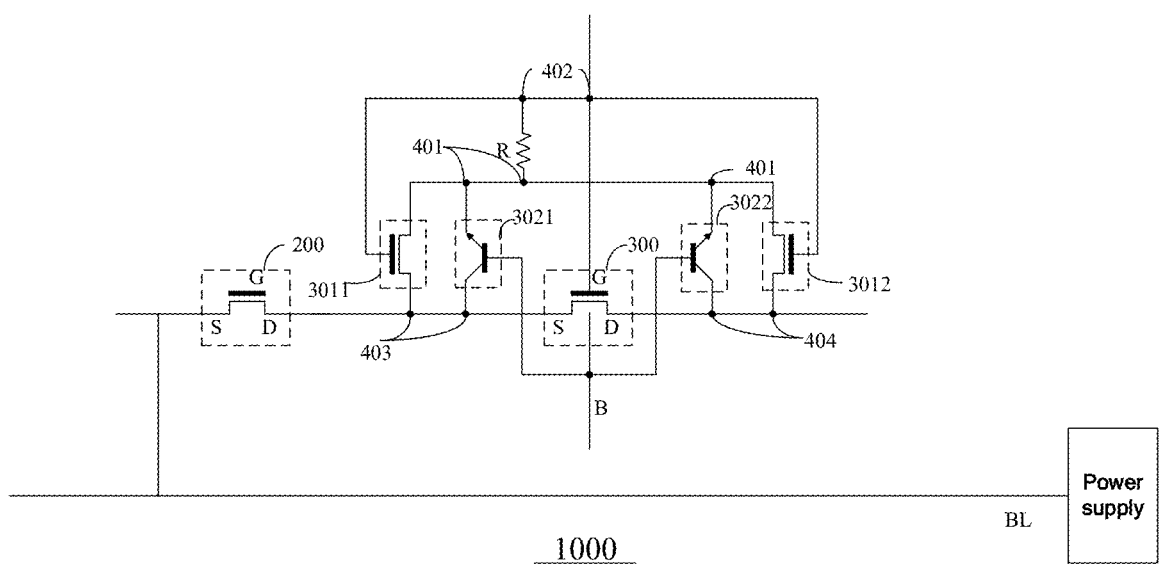
FIG. 9 is a third schematic diagram of yet still another anti-fuse circuit provided by an embodiment of the present disclosure.

When the simulation test needs to be performed on the anti-fuse unit in the breakdown state, the anti-fuse circuit illustrated in FIG. 7 can be used to replace the first transistor 300 illustrated in FIG. 8 to obtain an anti-fuse circuit illustrated in FIG. 9 which is used to simulate and test the anti-fuse unit in the breakdown state. The second transistor 200 is connected in series to the anti-fuse circuit illustrated in FIG. 7, and the first electrode of the second transistor 200 can be a source or a drain. The first electrode of the second transistor 200 is connected to the source or the drain of the first transistor 300 in the anti-fuse circuit. That is to say, the first electrode of the second transistor 200 can be connected to the third node 403 or the fourth node 404. When the first electrode of the second transistor 200 is the drain, the second electrode of the second transistor 200 is the source; and when the first electrode of the second transistor 200 is the source, the second electrode of the second transistor 200 is the drain. The second electrode of the second transistor 200 is further connected to the bit line, and is connected to the power supply via the bit line. The gate of the second transistor 200 is connected to the first control signal terminal 210, and the first control signal terminal 210 is configured to control the second transistor 200 to be turned on or turned off.

Figure 10:
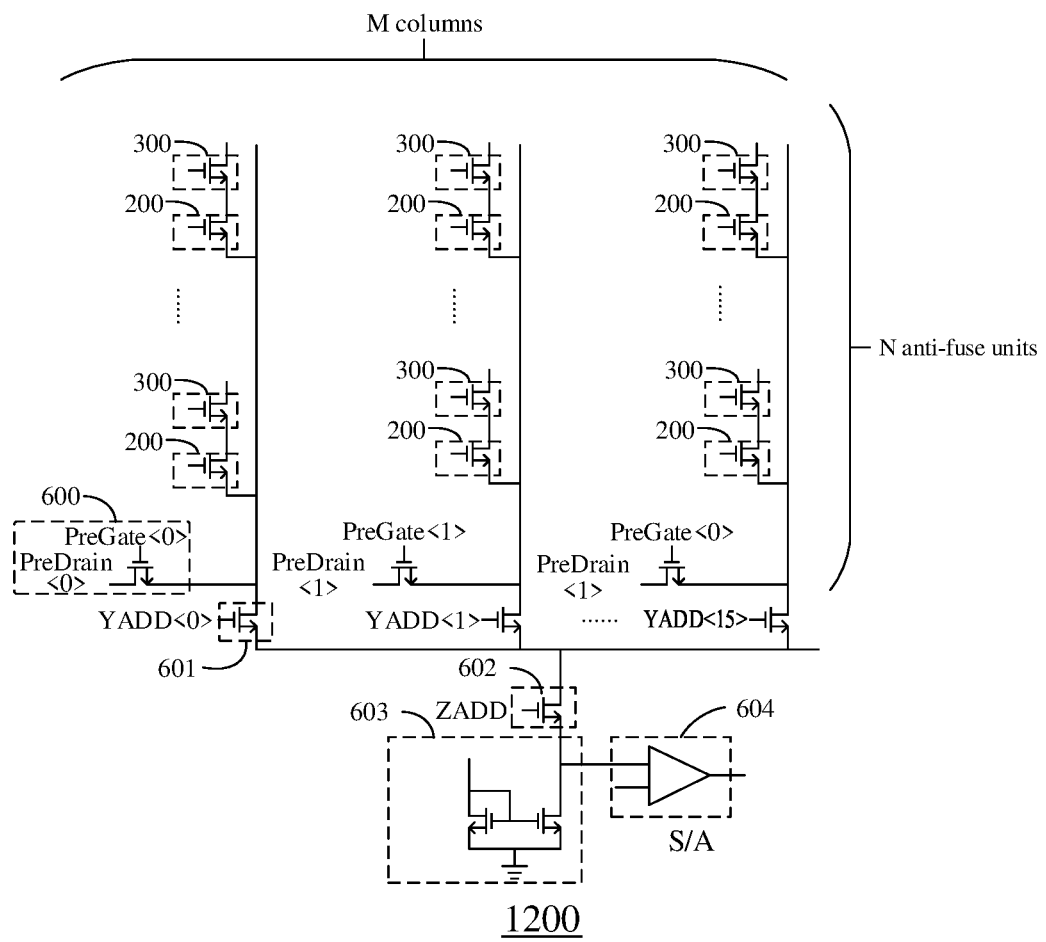
FIG. 10 is a schematic diagram of an anti-fuse array provided by an embodiment of the present disclosure.

The anti-fuse unit can be further used to form an anti-fuse array 1200 as illustrated in FIG. 10. The anti-fuse array 1200 includes M columns, and each column contains N anti-fuse units. Each column in the anti-fuse array 1200 is further connected to a respective pre-charge transistor (Pre-Charge TR) 600. The pre-charge transistor 600 provides a pre-charge voltage (i.e., Vprechg voltage) based on a gate signal PreGate and a drain signal PreDrain. The Vprechg voltage is used to protect non-target-programmed anti-fuse units, and BLs of the non-target-programmed anti-fuse units will be pre-charged to the Vprechg voltage. In this way, non-target-programmed anti-fuse units are prevented from being damaged during programming of target-programmed anti-fuse units.

Each column in the anti-fuse array 1200 is further connected to a respective column select transistor 601, a gate of the column select transistor 601 is controlled by a signal YADD, and the column select transistor 601 is configured to control an output of the connected BL voltage.

Multiple column select transistors 601 are further connected to a chip select transistor 602, a gate of the chip select transistor 602 is controlled by a signal ZADD. An operation performed on a target anti-fuse unit includes the reading operation or the programming operation, both of which require selecting a chip position where the target anti-fuse unit is located at first, and then selecting a column position where the target anti-fuse unit is located.

The chip select transistor 602 is further connected to a current clamp circuit 603. The current clamp circuit 603 is used to provide a stable current and perform current limit control of the programmed current during a blowing process of the anti-fuse, so that the distribution of the programmed fuse resistance is more concentrated. After the anti-fuse is blown, the current clamp circuit 603 does not work during the reading process, a readout voltage comes from the anti-fuse and is compared with a reference voltage of a second input terminal of a sense amplifier 604 to obtain "0" or "1" which indicates a state of the anti-fuse unit (i.e. stored data).

When performing testing on the anti-fuse array 1200, the anti-fuse circuit illustrated in FIG. 7 can be selected, based on states of anti-fuse units in the anti-fuse array 1200, to test the first transistor 300.

The above are only examples of scenarios in which the anti-fuse circuit according to the embodiments disclosed above can be used for the simulation test. The anti-fuse circuit in the embodiments of the present disclosure can simulate and test any circuit including at least one anti-fuse transistor in the breakdown state.

An embodiment of the present disclosure further provides a circuit testing method. The method includes following operations.

An anti-fuse circuit is established based on an anti-fuse transistor in a breakdown state. The anti-fuse circuit includes a first transistor, at least one parasitic transistor and at least one parasitic triode.

Based on the anti-fuse circuit, testing is performed on the anti-fuse transistor in the breakdown state.

When the anti-fuse circuit has been established in an anti-fuse circuit SPICE simulation software, if a semiconductor device including the anti-fuse transistor in the breakdown state needs to be tested, the anti-fuse circuit described in the above embodiments can be directly invoked. Parameters of the anti-fuse circuit can be extracted with the aid of technology computer aided design (TCAD) to obtain electrical characteristic data of the anti-fuse transistor over which the hard breakdown occurs at different positions between a source and a drain of the anti-fuse transistor, and then parameter extraction and optimization are performed based on the obtained data, and finally the anti-fuse circuit can be optimized and improved based on the actual test data.

In some embodiments, the simulation of the change of the anti-fuse transistor from the non-breakdown state to the breakdown state can be achieved by switching different anti-fuse circuits during the circuit simulation test. Exemplarily, when performing the simulation test on the anti-fuse transistor in the non-breakdown state, an anti-fuse circuit including the above-mentioned first transistor and not including other parasitic elements/components can be used to perform the simulation test. When performing the simulation test on the anti-fuse transistor in the breakdown state, the anti-fuse circuit including the above-mentioned parasitic elements/components is used to perform the simulation test. The simulation test for circuits including at least one anti-fuse transistor can be achieved by using different anti-fuse circuits.

Figure 11:
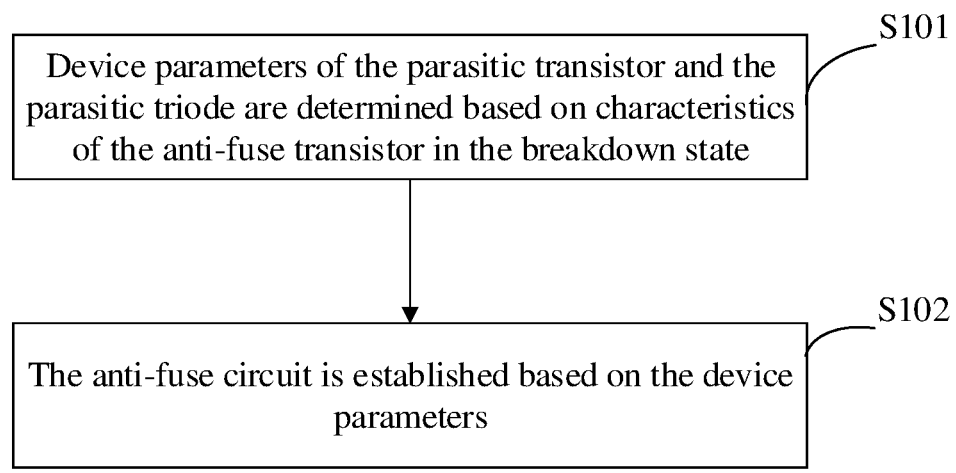
FIG. 11 is a flowchart of a circuit testing method provided by an embodiment of the present disclosure.

In some embodiments, as illustrated in FIG. 11, the operation that the anti-fuse circuit is established based on the anti-fuse transistor in the breakdown state includes the following operations.

At an operation S101, device parameters of the parasitic transistor and the parasitic triode are determined based on characteristics of the anti-fuse transistor in the breakdown state.

At an operation S102, the anti-fuse circuit is established based on the device parameters.

In some embodiments, the operation that the device parameters of the parasitic transistor and the parasitic triode are determined based on the characteristics of the anti-fuse transistor in the breakdown state includes the following operation.

A gate length of the parasitic transistor and a base length of the parasitic triode are determined based on a position parameter of a breakdown point of the anti-fuse transistor in the breakdown state.

In some embodiments, the anti-fuse circuit further includes a parasitic resistor. The method further includes the following operation.

A device parameter of the parasitic resistor is determined based on the characteristics of the anti-fuse transistor in the breakdown state.

In some embodiments, the operation that the device parameter of the parasitic resistor is determined based on the characteristics of the anti-fuse transistor in the breakdown state includes the following operation. A resistance of the parasitic resistor is determined based on a position parameter of a breakdown point of the anti-fuse transistor in the breakdown state and a thickness of a gate dielectric layer of the anti-fuse transistor.

Exemplarily, the device parameters of the parasitic transistor may include the gate length of the parasitic transistor, a size of a doped region of the parasitic transistor, a concentration of doped ions, a material of a gate dielectric layer, and the like. The device parameters of the parasitic triode may include the base length of the parasitic triode, a size of a doped region of the parasitic triode, a concentration of doped ions, and the like. The device parameter of the parasitic resistor may include the resistance of the parasitic resistor.

The device parameters of the parasitic transistor and the parasitic triode can be determined by characteristics of the anti-fuse transistor itself. The characteristics of the anti-fuse transistor itself may include an original gate length, a size of a doped region, an ion concentration of a doped region, a material of a gate dielectric layer of the anti-fuse transistor itself. In addition, the device parameters of the parasitic transistor and the parasitic triode can further be determined by the characteristics of the anti-fuse transistor in the breakdown state.

In some embodiments, the characteristics of the anti-fuse transistor in the breakdown state may include the position parameter of the breakdown point. The position of the breakdown point is located between the source and the drain of the anti-fuse transistor. The position parameter of the breakdown point is a parameter for representing a position characteristic of the breakdown point in the anti-fuse transistor.

In some embodiments, the resistance of the parasitic resistor has a first corresponding relationship with the position parameter of the breakdown point, the gate length of the parasitic field effect transistor has a second corresponding relationship with the position parameter of the breakdown point, and the base length of the parasitic triode has a third corresponding relationship with the position parameter of the breakdown point.

In the embodiments of the present disclosure, the resistance of the parasitic resistor can be determined based on factors such as the position parameter of the breakdown point, the first corresponding relationship, the thickness of the gate dielectric layer of the anti-fuse transistor, and the like. The gate length of the parasitic transistor can be determined based on factors such as the position parameter of the breakdown point and the second corresponding relationship. The base length of the parasitic triode can be determined based on factors such as the position parameter of the breakdown point and the third corresponding relationship.

Finally, the anti-fuse circuit is established based on the electrical parameters of the devices, i.e., the parasitic transistor, the parasitic triode and the parasitic resistor.

In some embodiments, the position parameter of the breakdown point includes at least one of: a preset first distance parameter or a preset second distance parameter.

The first distance parameter is used to represent a distance from the breakdown point of the anti-fuse transistor to a first electrode of the anti-fuse transistor.

The second distance parameter is used to represent a distance from the breakdown point of the anti-fuse transistor to a second electrode of the anti-fuse transistor.

In some embodiments, the operation that based on the anti-fuse circuit, testing is performed on the anti-fuse transistor in the breakdown state includes the following operations.

A preset test voltage is applied to a detecting terminal of the anti-fuse circuit.

A ground voltage is applied to terminals, other than the detecting terminal, of the anti-fuse circuit to obtain a current value of the detecting terminal.

Based on the current value and the preset test voltage, a voltage-current curve of the detecting terminal is determined.

In some embodiments, the detecting terminal is any one of a first electrode of the first transistor, a second electrode of the first transistor, a substrate of the first transistor, and a gate of the first transistor.

In some embodiments, the preset test voltage can be a voltage value; or the preset test voltage can be a voltage range, for example, a range of 0 to 3V. When the preset test voltage is the voltage range, the preset test voltage can be increased from a certain initial value (e.g., 0V), and the voltage increasing process can be performed on the preset test voltage according to a certain voltage increasing rule (for example, each increase value is a fixed value 0.3V), or the voltage increasing process can be performed on the preset test voltage according to a random voltage increasing process.

The preset test voltage can be applied to the detecting terminal of the anti-fuse circuit. In some embodiments, the detecting terminal can be any one of the first electrode of the first transistor, the second electrode of the first transistor, the substrate of the first transistor and the gate of the first transistor.

For example, when the first electrode of the first transistor is the detecting terminal, the second electrode of the first transistor, the substrate the first transistor and the gate of the first transistor are receiving terminals.

When the preset test voltage is applied to the detecting terminal of the anti-fuse circuit, a lower voltage, such as a ground voltage, can be applied to terminals other than the detecting terminal. In this way, the voltage-current curve of the detecting terminal can be obtained. In some embodiments, the preset test voltage applied to the detecting terminal can be varied, while the test voltage applied to the terminals other than the detecting terminal can be constant (i.e., maintained at a lower voltage value), that is, the voltage-current curve of the detecting terminal is obtained by using a variable controlling method. The preset test voltage of the detecting terminal can be the only variable.

Figure 12:
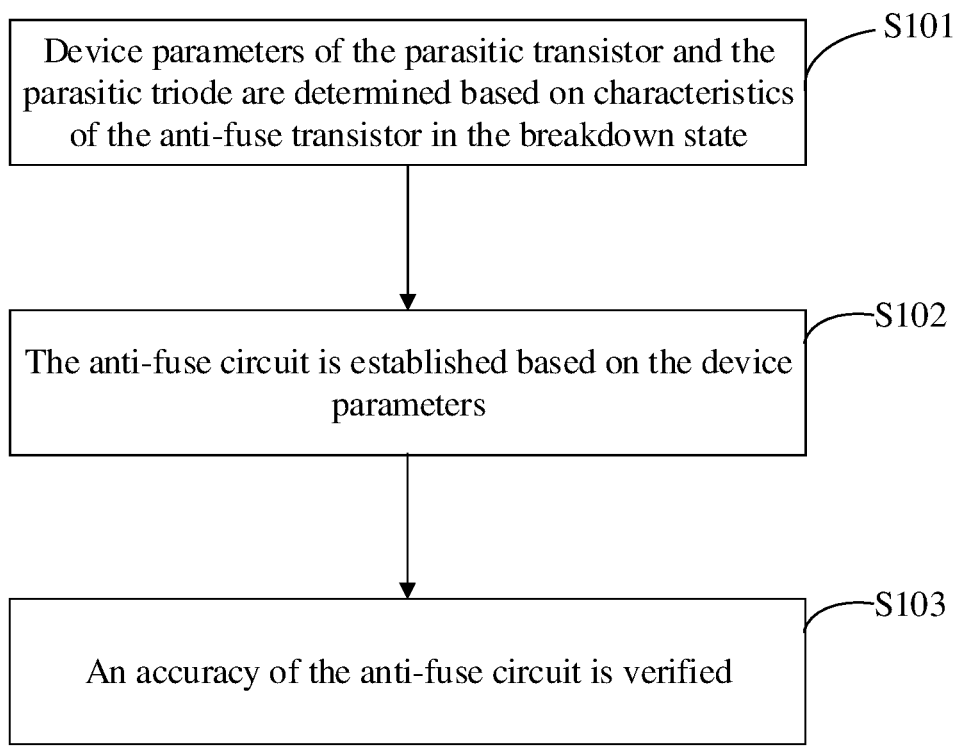
FIG. 12 is a flowchart of another circuit testing method provided by an embodiment of the present disclosure.

In some embodiments, as illustrated in FIG. 12, the method further includes the following operation.

At an operation S103, an accuracy of the anti-fuse circuit is verified.

After the anti-fuse circuit is established, the accuracy of the anti-fuse circuit can also be verified. Only the anti-fuse circuit with the qualified accuracy can be considered as a successful test model.

A criterion for the accuracy of the anti-fuse circuit can be as follows. Under the same voltage or within the same voltage range, a difference between a value of a test current of the anti-fuse circuit and a value of a reference current of a test anti-fuse transistor is less than or equal to a preset value. Specifically, the evaluation criteria for the accuracy of the anti-fuse circuit can be as follows. For the same receiving terminal, under the same voltage or within the same voltage range, (test current-reference current)/test current*100%≤10%, or under the same voltage or within the same voltage range, (reference current-test current)/test current*100%≤10%.

In some embodiments, the operation that the accuracy of the anti-fuse circuit is verified includes following operations.

A test anti-fuse transistor in a breakdown state is selected.

The anti-fuse circuit corresponding to the test anti-fuse transistor is established.

A preset test voltage is applied to a detecting terminal of the test anti-fuse transistor, and a reference current value of the detecting terminal of the test anti-fuse transistor is detected.

The preset test voltage is applied to a detecting terminal of the anti-fuse circuit, and a test current value of the detecting terminal of the anti-fuse circuit is detected.

A test accuracy of the anti-fuse circuit is determined based on a difference between the test current value and the reference current value.

An anti-fuse circuit corresponding to the test anti-fuse transistor can be established based on structural characteristics of the test anti-fuse transistor and characteristics of a breakdown point of the test anti-fuse transistor.

When the anti-fuse circuit is established, the accuracy of the anti-fuse circuit can be tested.

The process of testing the accuracy of the anti-fuse circuit can be as follows.

Firstly, a voltage-current test can be performed on the test anti-fuse transistor in the breakdown state. After the voltage-current test, the reference current value corresponding to the test anti-fuse transistor at the preset test voltage can be obtained.

In some embodiments, the preset test voltage can be applied to any terminal of the gate, the source, the drain and the substrate of the anti-fuse transistor. A lower voltage, such as the ground voltage, can be applied to terminals (except the detecting terminal) to which the preset test voltage is not applied.

The accuracy of the anti-fuse circuit can also be evaluated after the voltage-current test is performed on the test anti-fuse transistor. An evaluation method can be as follows. Based on the same voltage condition, the test current value is compared with the reference current value, if the difference between the test current value and the reference current value is less than or equal to the preset value, then the established anti-fuse circuit is considered is to be accurate.

For example, under the same voltage or within the same voltage range, if (test current-reference current)/test current*100%≤10%; or (reference current-test current)/test current*100%≤10%, it is considered that the established anti-fuse circuit is accurate.

When the anti-fuse circuit is considered to be an accurate simulation test model, the anti-fuse circuit can be used in the SPICE simulation software for performing a simulating test on a semiconductor structure including an anti-fuse transistor.

It should be understood that reference throughout the specification to "some embodiments", "one embodiment" or "an embodiment" means that a particular feature, structure, or property associated with the embodiments is included in at least one embodiment of the present disclosure. Thus, appearances of "in one embodiment" or "in an embodiment" in various places throughout the specification are not necessarily referring to the same embodiment. Furthermore, the particular features, structures or properties can be combined in any suitable manner in one or more embodiments. It should be understood that in various embodiments of the present disclosure, the size of the sequence numbers of the above-mentioned processes does not imply the sequence of execution, and the execution sequence of each process should be determined by its functions and internal logic, rather than constitutes any limitation to implementations of the embodiments of the present disclosure. The above-mentioned sequence numbers of the embodiments of the present disclosure are only for description, and do not represent the advantages or disadvantages of the embodiments.

It should be noted that in the present disclosure, the terms "include", "including" or any other variation thereof are intended to encompass non-exclusive inclusion, such that a process, method, article or apparatus including a series of elements includes not only those elements, but also includes other elements not expressly listed or inherent to such a process, method, article or apparatus. Without further limitation, an element defined by the phrase "including a . . . " does not preclude the presence of additional identical elements in the process, method, article or apparatus that includes the element.

The above embodiments are only implementation of the present disclosure, but the protection scope of the present disclosure is not limited thereto. Any person skilled in the art who is familiar with the technical scope of the present disclosure can easily think of changes or substitutions, which should fall within the scope of protection of the present disclosure. Therefore, the protection scope of the present disclosure should be subject to the protection scope of the claims.

The anti-fuse circuit provided by the embodiments of the present disclosure can be used to simulate and test an anti-fuse device. Electrical characteristics of an anti-fuse transistor in a breakdown state are simulated by a first transistor and at least one parasitic transistor and at least one parasitic triode that are connected to the first transistor. Compared with a method of simply simulating the anti-fuse transistor in the breakdown state by only setting a certain resistance value between a gate and a source of the anti-fuse transistor or between a gate and a drain of the anti-fuse transistor, the anti-fuse circuit according to the present disclosure can realize a more accurate description of electrical characteristics of the anti-fuse transistor in the breakdown state. Such anti-fuse circuit is applied to a circuit simulation testing, which can achieve a more accurate test effect and facilitate experiments and researches on a memory and a circuit including the anti-fuse transistor.

What is claimed is:

1. A simulation test model for anti-fuse circuit, comprising:
   a first transistor; and
   at least one parasitic transistor and at least one parasitic triode that are connected to the first transistor,
   wherein the at least one parasitic transistor and the at least one parasitic triode are connected to a first node;
   wherein the simulation test model is an equivalent circuit of an anti-fuse transistor in a breakdown state, and the first node is used to represent a breakdown point of the anti-fuse transistor; the first transistor is used to simulate a basic structure and characteristics of the anti-fuse transistor in the non-breakdown state;
   wherein a gate of the first transistor is a second node, a first electrode of the first transistor is a third node, a second electrode of the first transistor is a fourth node, and a substrate of the first transistor is a fifth node; and
   wherein a source of the parasitic transistor is connected to one of the third node or the fourth node;
   a gate of the parasitic transistor is connected to the second node;
   a drain of the parasitic transistor is connected to the first node;
   a collector of the parasitic triode is connected to anther of the third node or the fourth node;
   an emitter of the parasitic triode is connected to the first node; and
   a base of the parasitic triode is connected to the fifth node.

2. The simulation test model for anti-fuse circuit of claim 1, wherein the at least one parasitic transistor comprises: a first parasitic field effect transistor and a second parasitic field effect transistor; and
   wherein a gate of the first parasitic field effect transistor is connected to the second node;
   a source of the first parasitic field effect transistor is connected to the third node;
   a drain of the first parasitic field effect transistor is connected to the first node;
   a gate of the second parasitic field effect transistor is connected to the second node;
   a source of the second parasitic field effect transistor is connected to the fourth node; and
   a drain of the second parasitic field effect transistor is connected to the first node.

3. The simulation test model for anti-fuse circuit of claim 1, wherein the at least one parasitic triode comprises: a first parasitic triode and a second parasitic triode; and
   wherein an emitter of the first parasitic triode is connected to the first node;
   a collector of the first parasitic triode is connected to the third node;
   a base of the first parasitic triode is connected to the fifth node;

an emitter of the second parasitic triode is connected to the first node;
a collector of the second parasitic triode is connected to the fourth node; and
a base of the second parasitic triode is connected to the fifth node.

4. The simulation test model for anti-fuse circuit of claim 1, further comprising: a parasitic resistor connected between the first node and the second node.

5. The anti-fuse circuit of claim 4, wherein a resistance of the parasitic resistor has a first corresponding relationship with a position parameter of the breakdown point.

6. The simulation test model for anti-fuse circuit of claim 5, wherein
the position parameter of the breakdown point comprises at least one of:
a preset first distance parameter representing a distance from the breakdown point of the anti-fuse transistor to a first electrode of the anti-fuse transistor, or
a preset second distance parameter representing a distance from the breakdown point of the anti-fuse transistor to a second electrode of the anti-fuse transistor.

7. The simulation test model for anti-fuse circuit of claim 1, wherein a gate length of the parasitic transistor has a second corresponding relationship with a position parameter of the breakdown point, and
a base length of the parasitic triode has a third corresponding relationship with the position parameter of the breakdown point.

8. The simulation test model for anti-fuse circuit of claim 1, further comprising:
a second transistor, connected to the first transistor,
wherein a first electrode of the second transistor is connected to the third node or the fourth node;
a second electrode of the second transistor is connected to a power supply terminal; and
a gate of the second transistor is connected to a first control signal terminal, wherein the first control signal terminal is configured to provide a control signal for the second transistor; and
wherein the second transistor is configured to perform a programming operation or a reading operation on the first transistor.

9. A circuit testing method, comprising:
establishing an anti-fuse circuit based on an anti-fuse transistor in a breakdown state, wherein the anti-fuse circuit comprises: a first transistor, at least one parasitic transistor and at least one parasitic triode, the at least one parasitic transistor and the at least one parasitic triode are connected to a first node, the anti-fuse circuit is an equivalent circuit of an anti-fuse transistor in a breakdown state, and the first node is used to represent a breakdown point of the anti-fuse transistor; the first transistor is used to simulate a basic structure and characteristics of the anti-fuse transistor in the non-breakdown state; and
performing, based on the anti-fuse circuit, testing on the anti-fuse transistor in the breakdown state;
wherein a gate of the first transistor is a second node, a first electrode of the first transistor is a third node, a second electrode of the first transistor is a fourth node, and a substrate of the first transistor is a fifth node; and
wherein a source of the parasitic transistor is connected to the third node or the fourth node;
a gate of the parasitic transistor is connected to the second node;

a drain of the parasitic transistor is connected to the first node;
a collector of the parasitic triode is connected to the third node or the fourth node;
an emitter of the parasitic triode is connected to the first node; and
a base of the parasitic triode is connected to the fifth node.

10. The circuit testing method of claim 9, wherein establishing the anti-fuse circuit based on the anti-fuse transistor in the breakdown state comprises:
determining device parameters of the parasitic transistor and the parasitic triode based on characteristics of the anti-fuse transistor in the breakdown state; and
establishing the anti-fuse circuit based on the device parameters.

11. The circuit testing method of claim 10, wherein determining the device parameters of the parasitic transistor and the parasitic triode based on the characteristics of the anti-fuse transistor in the breakdown state comprises:
determining, based on a position parameter of a breakdown point of the anti-fuse transistor in the breakdown state, a gate length of the parasitic transistor and a base length of the parasitic triode.

12. The circuit testing method of claim 11, wherein the position parameter of the breakdown point comprises at least one of:
a preset first distance parameter representing a distance from the breakdown point of the anti-fuse transistor to a first electrode of the anti-fuse transistor, or
a preset second distance parameter representing a distance from the breakdown point of the anti-fuse transistor to a second electrode of the anti-fuse transistor.

13. The circuit testing method of claim 10, wherein the anti-fuse circuit further comprises a parasitic resistor, and the method further comprises:
determining a device parameter of the parasitic resistor based on the characteristics of the anti-fuse transistor in the breakdown state.

14. The circuit testing method of claim 13, wherein determining the device parameter of the parasitic resistor based on the characteristics of the anti-fuse transistor in the breakdown state comprises:
determining a resistance of the parasitic resistor based on a position parameter of a breakdown point of the anti-fuse transistor in the breakdown state and a thickness of a gate dielectric layer of the anti-fuse transistor.

15. The circuit testing method of claim 9, wherein performing, based on the anti-fuse circuit, the testing on the anti-fuse transistor in the breakdown state comprises:
applying a preset test voltage to a detecting terminal of the anti-fuse circuit;
applying a ground voltage to terminals, other than the detecting terminal, of the anti-fuse circuit to obtain a current value of the detecting terminal; and
determining a voltage-current curve of the detecting terminal based on the current value and the preset test voltage.

16. The circuit testing method of claim 15, wherein the detecting terminal is any one of a first electrode of the first transistor, a second electrode of the first transistor, a substrate of the first transistor, and a gate of the first transistor.

17. The circuit testing method of claim 9, further comprising:
verifying accuracy of the anti-fuse circuit.

18. The circuit testing method of claim 17, wherein verifying the accuracy of the anti-fuse circuit comprises:
selecting a test anti-fuse transistor in a breakdown state;

establishing the anti-fuse circuit corresponding to the test anti-fuse transistor;

applying a preset test voltage to a detecting terminal of the test anti-fuse transistor, and detecting a reference current value of the detecting terminal of the tested anti-fuse transistor;

applying the preset test voltage to a detecting terminal of the anti-fuse circuit, and detecting a test current value of the detecting terminal of the anti-fuse circuit; and determining, based on a difference between the test current value and the reference current value, a test accuracy of the anti-fuse circuit for a simulation test.

* * * * *